Figure 1:
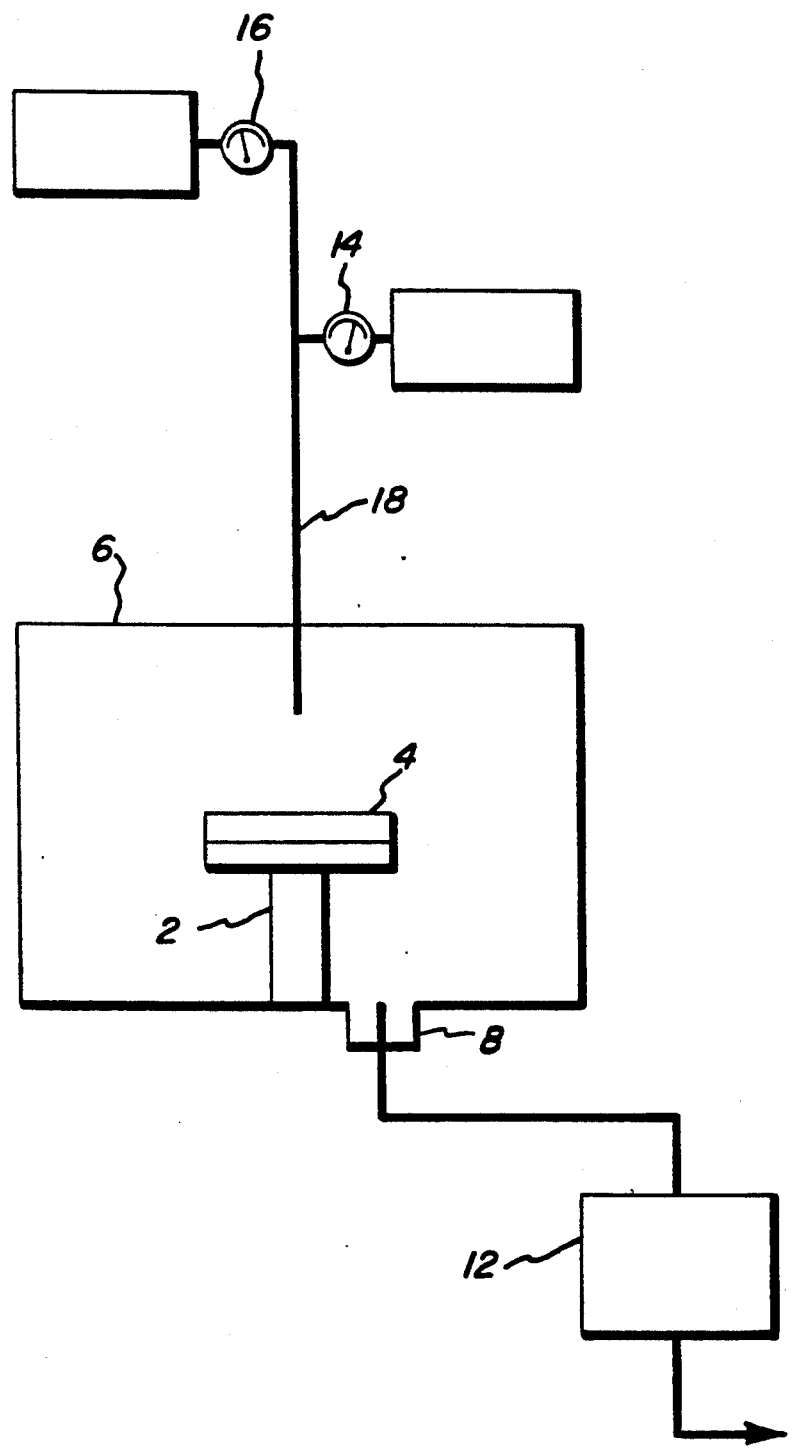

United States Patent [19]

Woodruff et al.

[11] Patent Number: 5,169,685

[45] Date of Patent: Dec. 8, 1992

[54] METHOD FOR FORMING NON-COLUMNAR DEPOSITS BY CHEMICAL VAPOR DEPOSITION

[75] Inventors: David Woodruff, Clifton Park, N.Y.; Joan M. Redwing, Madison, Wis.; Rony A. Sanchez-Martinez, Schenectady, N.Y.

[73] Assignee: General Electric Company, Schenectady, N.Y.

[21] Appl. No.: 607,972

[22] Filed: Nov. 1, 1990

Related U.S. Application Data

[62] Division of Ser. No. 364,388, Jun. 12, 1989, abandoned.

[51] Int. Cl.$^5$ ................. C23C 16/06; C23C 16/08
[52] U.S. Cl. ................. 427/250; 427/251; 427/252; 427/253; 427/255.1; 427/255.2; 427/255.5
[58] Field of Search ........... 427/248.1, 250, 252, 427/253, 255.1, 255.2, 255.5, 251

[56] References Cited

U.S. PATENT DOCUMENTS

| | | | |
|---|---|---|---|
| 2,698,812 | 1/1955 | Schladitz | 427/252 |
| 3,127,641 | 4/1964 | Pertwee | 427/252 |
| 3,637,374 | 1/1972 | Holzi et al. | 427/253 |
| 3,703,405 | 11/1972 | Brenner et al. | 427/253 |
| 4,062,318 | 12/1977 | Ban et al. | 118/49 |
| 4,082,865 | 4/1978 | Ban et al. | 427/253 |
| 4,118,539 | 10/1978 | Hirai et al. | 156/614 |
| 4,138,512 | 2/1979 | Glaski | 427/253 |
| 4,162,345 | 7/1979 | Holzl | 428/328 |
| 4,427,445 | 1/1984 | Holzl et al. | 75/234 |
| 4,499,853 | 2/1985 | Miller | 118/725 |
| 4,532,199 | 7/1985 | Ueno | 430/128 |
| 4,583,492 | 4/1986 | Cowher | 118/723 |
| 4,664,743 | 5/1987 | Moss | 156/613 |
| 5,024,901 | 6/1991 | Garg et al. | 427/253 |

OTHER PUBLICATIONS

Brick, Pense, and Gordon, Structure and Properties of Engineering Materials, McGraw Hill, 1977.
Effects of Acoustic Wave Irradiation on Chemical Vapour Deposition, K. Sugiyama, et al, Dept. of Applied Chem, Faculty of Engineering, Nagoya Univ, Chikusa-Ku, Nagoya 464 (Japan), pp. 257-262.
Chemical Vapor Deposition and Characterization of Tungsten-Rhenium Alloys, J. I. Federer et al. Metals and Ceramics Division, Oak Ridge National Lab., Oak Ridge, Tenn. 37830, Research sponsored by the USAEC under contract with the Union Carbide Corp.—3rd Int. CVD Conf. (1972) pp. 242-253.
Review The Fundamentals of Chemical Vapour Deposition, W. A. Bryant, Westinghouse Research & Development Ctr., Pittsburgh, Pa.—article—Journal of Materials Science 12 (1977) pp. 1285-1306.
Simultaneous Chemical Vapor Deposition of SiC-Dispersed Phase Composites, D. P. Stinton et al-Metals and Ceramics Div., Oak Ridge National Laboratory, Oak Ridge, Tenn. 37831—article—Ceramic Eng. Sci. Proc. 6(7-8), pp. 707-713 (1985).
CVD Tungsten and Tungsten-Rhenium Alloys for Structural Applications, Part 1: Process Development, W. R. Holman and F. J. Huegel, University of California, Lawrence Radiation Lab., Livermore, Calif. 94551—pp. 127-148.

(List continued on next page.)

Primary Examiner—Shrive Beck
Assistant Examiner—Bret Chen
Attorney, Agent, or Firm—William H. Pittman

[57] ABSTRACT

Fine-grained and/or equiaxed coatings, substantially free from columnar structure, are deposited on substrates by chemical vapor deposition by directing the flow of reactant gases to the substrate with high velocity and in close proximity thereto, most often at a velocity gradient of at least about 1050 and preferably at least about 2000 cm./cm.-sec. The deposition process is preferably conducted while moving the substrate so as to coat large areas thereof. By this method, tungsten and/or rhenium X-ray targets having excellent properties under conditions of rapid temperature cycling may be produced.

31 Claims, 2 Drawing Sheets

OTHER PUBLICATIONS

Study of the Properties of Tungsten Coatings Produced by Vapor-Phase Deposition, Yu. S. Kasatkin, et al—UDC 539-4—Original article submitted Jul. 2, 1973—pp. 247-250.

Producing Extended Area Deposits of Uniform Thickness by a New Chemical Vapor Deposition Technique, W. A. Bryant—Journal of Crystal Growth 35 (1976) pp. 257-261.

The Vapour Phase Deposition of Metals and Their Compounds: Applications in Electronics, R. H. Buck, Microelectronics and Reliability, Pergamon Press 1967, vol. 6, pp. 231-237—Printed in Great Britain.

METHOD FOR FORMING NON-COLUMNAR DEPOSITS BY CHEMICAL VAPOR DEPOSITION

This application is a division of application Ser. No. 07/364,388, filed Jun. 12, 1989, now abandoned.

This invention pertains generally to vapor deposition of films on substrates and more specifically to high temperature- and oxidation-resistant metal coatings having improved mechanical and thermal properties. In particular, this invention is concerned with the process of chemical vapor deposition of metal coatings on substrates from vaporous metal halide precursors to form fine-grained and/or equiaxed deposits or films having improved properties. More particularly, this invention is directed to such processes wherein the microstructure of deposited films has been altered by directing the flow of reactant gases comprising the vaporous metal halide precursors to the surface of a substrate with high velocity and in close proximity thereto.

Chemical vapor deposition processes are important methods for depositing thin layers of a large variety of commercially important elements such as tungsten, rhenium, molybdenum, and silicon and many alloys as well as compounds including oxides, nitrides and carbides on substrates. Such processes are useful, for example, in producing mechanically functional coatings which are wear and corrosion resistant, and hard coatings for cutting tools; chemically functional coatings, such as corrosion resistant coatings and coatings for engine blades and vanes; and electrically functional coatings, such as for use in electrical conductors, electrical contacts and insulators. Chemical vapor deposition of tungsten in particular has found use in solid state electronics and for the manufacture of focal tracks for X-ray targets.

In a general sense, chemical vapor deposition (hereinafter frequently designated "CVD") is the process of depositing a solid product layer on a substrate by a reaction involving one or more precursor compounds of the deposited material in the vapor phase. For example, CVD of tungsten, rhenium and combinations thereof may be accomplished thermally by the decomposition of a gaseous zerovalent tungsten or rhenium compound such as tungsten hexacarbonyl or rhenium pentacarbonyl. More often, however, the precursor compounds are a compound (typically a halide) of tungsten or rhenium in combination with a gaseous reducing agent such as hydrogen. The reactions which then take place may be represented by the following equations, individually or in combination:

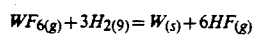

$$WF_{6(g)} + 3H_{2(g)} = W_{(s)} + 6HF_{(g)}$$

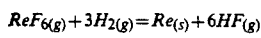

$$ReF_{6(g)} + 3H_{2(g)} = Re_{(s)} + 6HF_{(g)}$$

In Conventional CVD processes, the reactant gas stream comprising the metal species to be deposited (hereinafter sometimes designated "precursor gas stream") typically flows into the reaction vessel through an inlet port which is usually a considerable distance from the substrate, insuring adequate mixing of gaseous reactants with already present gaseous materials to the end of obtaining a substantially uniform deposit thickness. Such processes typically produce deposits on non-single crystal substrates which are of a polycrystalline structure and columnar in shape, consisting of a number of crystalline grains which are packed very closely together but are not joined together as a single crystal. The grain boundaries between these grains result in weak spots. When a film fails or fractures, it is prone to do so along the grain boundaries. Columnar films are frequently brittle and have low tensile strength by reasons of cracks which can easily propagate through the entire thickness of the film by following the columnar grain boundaries. This is particularly true under high temperature conditions or rapid, severe temperature cycling conditions typical of X-ray targets. Coatings comprising columnar polycrystalline deposits are, therefore, not desirable in such applications.

The initial stage in a CVD process is a nucleation phenomenon on the substrate, which forms "islands" of the deposited material scattered across the substrate surface. Under normal conditions, these "islands" grow outward and upward until they contact each other and form the first areas of grain boundary; grain growth then continues without substantial renucleation and in a columnar fashion.

However, the preferred coatings which have such desirable properties as high mechanical strength and fracture toughness in addition to high fatigue strength, hardness, friction and wear properties, and corrosion resistance, consist of very fine-grained deposits, preferably with equiaxed grains. For purposes of this invention, equiaxed films or deposits can be described as having an aspect ratio of the grain nearly equal to one. Such films are generally stronger than columnar films due to the results of increased grain boundary area over which an impinging force can be spread and the indirect path that a crack would take from the top surface to the base of the film.

In contrast to columnar grain growth, formation of equiaxed grains requires frequent renucleation. This demands very specialized conditions, since growth on an existing crystal surface is thermodynamically favored over formation of a new nucleus on which to grow a new grain. Thus, for the formation of equiaxed grains renucleation is essential, although it is not required for grain growth in general.

A major advantage of CVD processes is the ability to control and optimize the mechanical properties of a coating microstructure, which can vary widely depending upon deposition conditions. For example, it is described in Kasatkin et al., "Study of the Properties of Tungsten Coatings Produced by Vapor-phase Deposition", Problemy Prochusti, No. 2, pp. 111-114, February 1975, that the use of sound vibrations during deposition of tungsten from the vapor phase breaks up the columnar structure characteristic of ordinary deposition conditions to produce a fine-grained structure. Likewise, it has been described in Sugiyama et al., "Effects of Acoustic Wave Irradiation on Chemical Vapor Deposition", Thin Solid Films, Vol. 112, pp. 257-256, Japan (1984), that in CVD processes, acoustic irradiation resulted in the formation of a uniform thick film consisting of a fine-grained rather than a columnar structure. It is further described in Holman et al., "CVD Tungsten and Tungstenrhenium Alloys for Structural Applications. Part 1: Process Development", Proc. of Conf. on Chemical Vapor Deposition of Refractory Metals, Alloys & Compounds, Gatlinburg, Tenn., pp. 127ff (1967), that rubbing or brushing or other "cold working" or mechanical working of the surface of a substrate during deposition has produced a refined grain size and equiaxed grain shape. It was thought that the energy supplied in this manner lowered the activation barrier to nucleation sufficiently to permit new grains to form as deposition proceeded. This same mechanism of producing fine-grained deposits has been encountered in fluidized bed deposition where the mechanical energy is supplied by collisions of the bed particles. For example, it has been described in Stinton et al., "Simultaneous Chemical Vapor Deposition of SiC-Dispersed Phase Composites, Metals and Ceramics", Ceramic Engineering Sci. Proc. 6, (7-8), 707-713 (1985), that deposition of coatings in a fluidized bed produced small, nearly equiaxed grains in contrast to the long columnar grains produced under standard coating conditions. It is described in Federer et al., "Chemical Vapor Deposition and Characterization of Tungsten-Rhenium Alloys", Proc. of 3rd Intern. Conf. on Chemical Vapor Deposition, pp. 242-252 (1972), that recrystallization after annealing deposits at high temperatures produced a nearly equiaxed structure, but with very large grain size. It is also known that the presence of extrinsic impurities purposely added to the deposition system by the introduction of one or more additional reactant gases can result in the formation and stabilization of an equiaxed structure. See, for example, Bryant, "The Fundamentals of Chemical Vapor Deposition", Journal of Materials Science, 12 (1977), pp. 1285-1306. In such manner, for example, tungsten deposits having an equiaxed structure have reportedly been produced by the introduction of potassium, oxygen and ammonium and the incorporation of silicon, carbon and HfN.

Further, it is disclosed in U.S. Pat. No. 4,162,345 (Holzl) that deposits of tungsten and carbon or molybdenum and carbon can be prepared which are free of columnar deposits and consist essentially of fine, equiaxed grains having greatly improved hardness, tensile strength and flexibility. This is achieved by the reaction of a gaseous volatile halide, off the substrate surface, with a gaseous organic compound containing carbon, hydrogen and oxygen in a substitution reaction to form intermediate liquid products. At least some of the intermediate products are thereafter reacted with hydrogen gas at the heated surface of the substrate to produce the desired solid product. U.S. Pat. No. 4,427,445 (Holzl et al.) also discloses a thermochemically deposited product with increased hardness, consisting primarily of a mixture of tungsten and carbon or tungsten, carbon and oxygen in two phases, one of which is pure tungsten and the other either a tungsten carbide or a tungsten carbide-tungsten oxide mixture, consisting essentially of equiaxed grains having an average dimension of less than 0.1 micron and free from columnar grain distribution.

Previous attempts to prepare metal deposits by CVD over a substrate of considerable surface area, such as one to be employed as an X-ray target, have included the standard method of continually flowing the precursor gas stream over the substrate, in addition to such alternative methods as altering the flow pattern of said gas stream such as periodically reversing its direction, rotating the substrate, combining gas flow reversal and substrate rotation, stirring the reactant gas, periodically repositioning the substrate, imposing a temperature gradient over the length of the substrate, and tilting the substrate at various angles. Such methods, however, have been reported as either producing a non-uniform deposit thickness or not being successful in coating an extended surface area. In addition, such methods do not teach or suggest the production of extended area fine-grained or equiaxed deposits. For other examples of chemically vapor depositing material on rotating substrates, see U.S. Pat. Nos. 4,499,853, 4,062,318 and 4,082,865.

A further approach has been to introduce reactant gases in a pulsating rather than in a continuous flow manner. While this method has been reported as overcoming some of the problems of non-uniform thickness, again, no mention has been made of producing extended-area fine-grained or equiaxed deposits. See Bryant, J. Crystal Growth, Vol. 35, p. 257 (1976).

Additionally, it has been reported that uniform tungsten-rhenium alloy deposits in the form of a 2-inch wide by 16-inch long sheet have been prepared using controlled temperature and pressure limits in addition to reduced $H_2/(WF_6 + ReF_6)$ ratios to give a finer grain structure than deposits prepared with more hydrogen in the reactant gas mixture. Such structures are reported as being typically columnar with a fine-grain deposited region, which after annealing at temperatures up to 2400° C. caused recrystallization and production of "nearly equiaxed" structures. Such an extra high-temperature annealing step, however, can pose problems with material and equipment costs on a production scale. Moreover, it can lead to the formation of tungsten carbide which is undesirable for this purpose.

The present invention provides a new and improved CVD process. In particular, it provides such a process wherein the grain structure is altered or disturbed during deposition so as to achieve a fine-grained film that is substantially non-columnar and preferably equiaxed in order to improve the strength and hardness of the film. In addition, there is provided a method and apparatus for producing such CVD coatings over relatively large and/or extended areas of substrate surfaces. Moreover, the invention provides improved articles useful as focal tracks for X-ray targets.

It has been found that fine-grained and preferably equiaxed structured metal deposits on substrates, substantially free of columnar structure, can be prepared by a CVD process wherein the microstructure of such deposits has been altered by directing the flow of reactant gases to the substrate with high velocity and in close proximity thereto.

In one of its aspects, therefore, the present invention is a method for forming a solid deposit on the surface of a substrate by chemical vapor deposition from at least one gaseous reactant, said method comprising supplying said gaseous reactant or reactants to the surface of the substrate at a velocity gradient effective to produce a deposit substantially free from columnar grains.

In the drawings, FIG. 1 a schematic cross-sectional view of one embodiment of a CVD reactor incorporating the present inventive method.

Figure 2:
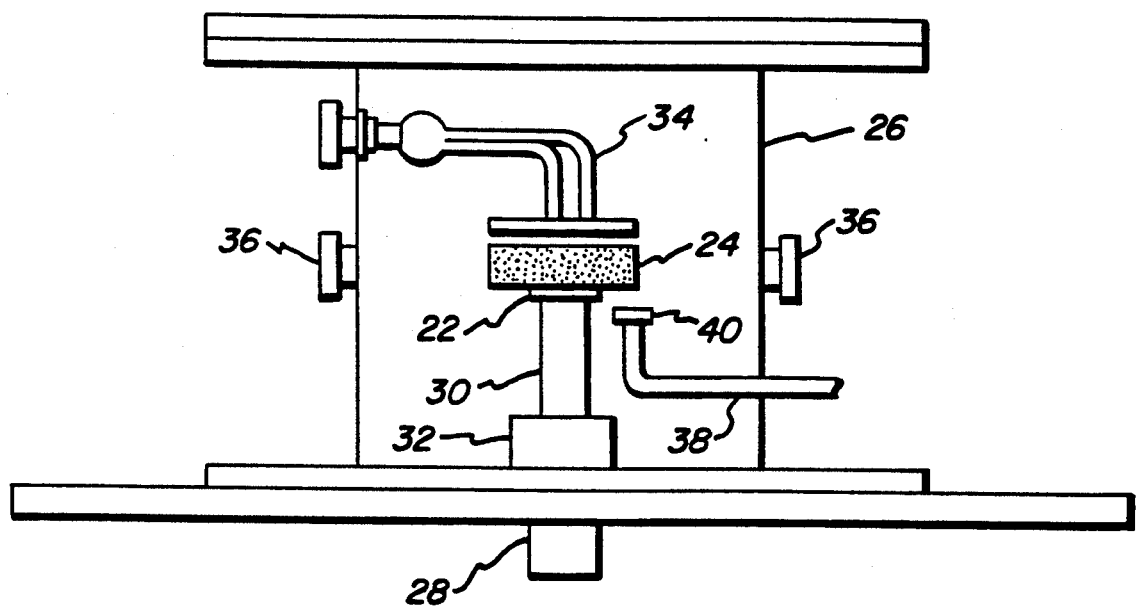

FIG. 2 is a similar view of a reactor incorporating a preferred embodiment of the invention, which permits the desired coatings to be efficiently deposited on a large surface.

While the invention is in no way dependent on theory, it is believed that fine-grained deposits are formed under the conditions of the invention as a result of the generation of very small elemental metal particles early in the CVD process, even before contact of the precursor gas stream with the substrate. At high velocity gradients, said particles strike and adhere to the substrate surface in relatively large quantities. The resulting high proportion of nucleation promotes further metal deposition in the form of the aforementioned fine and often equiaxed grains.

The present inventive method can be easily adapted for use with conventional vapor deposition methods and, thus, in practice any of the known compounds or mixtures thereof capable of undergoing conventional vapor deposition are suitable for use as the precursor gas stream. Generally, the basic requirements of such compounds are that they possess sufficient volatility for ease of transport from a precursor feed system into a CVD reactor, and also make for the easy removal of any non-reduced, non-decomposed or otherwise unreacted feed material and reaction by-products which form as a result of the vapor deposition reaction.

The invention is applicable to all metals and metal compounds capable of chemical vapor deposition. These include such metals as silver, aluminum, gold, beryllium, chromium, copper, iridium, molybdenum, niobium, nickel, platinum, rhenium, rhodium, tantalum, tungsten, vanadium, titanium, zirconium and hafnium as well as carbides, nitrides, oxides, borides and silicides thereof. Mixtures and alloys of these metals and compounds may also be deposited, as may such semiconductor materials as silicon, germanium, gallium arsenide and aluminum phosphide. For a more complete discussion of compounds suitable for vapor phase deposition in the process of the present invention see Buck, "The Vapor Phase Deposition of Metals and Their Compounds: Applications in Electronics", Microelectronics and Reliability, Vol. 6, pp. 231-237 (1967).

As previously mentioned, it is possible to deposit the metal from a zerovalent compound thereof. More often, however, it is convenient to employ a compound of the metal in a positive valence state, frequently a halide such as tungsten hexafluoride or rhenium hexafluoride, in combination with a reducing gas, typically hydrogen.

In its broadest sense, the term "substrate" as used herein is intended to include any form of surface including shaped articles upon which the coating is deposited, or otherwise any workpiece to be treated by the precursor gas stream. For example, the process of the present invention can be employed to deposit coatings on both conducting and non-conducting substrates; exemplary substrate materials are graphite, silicon, ceramics, metals, oxides and borides. Experience has shown, however, that for purposes of coating adherence, the coating's coefficient of thermal expansion is preferably closely matched with that of the substrate to prevent cracking or spalling. Further, because of the novel feature of the present invention of directing the precursor gas stream to the substrate at high velocity and in close proximity, deposition of fine-grained or equiaxed materials can occur on shaped articles over substantial contours and in otherwise inaccessible locations, for example, on substrates for use in microelectronics applications, such as down very fine holes needed in some cases to provide circuit interconnections.

The process of the present invention is also suitable for fabricating free-standing shaped articles comprising fine-grained and/or equiaxed structured deposits. Components can be produced by known methods, such as depositing a relatively thick coating onto a mandrel and subsequently removing the mandrel, whereby the dimensions of the component are controlled by the shape of the mandrel and the thickness of the applied coating.

The apparatus to conduct the method of the present invention preferably comprises the following components:

(1) CVD reactor means comprising a substrate supporting means, a means for heating a substrate to a temperature at which chemical vapor deposition is effected thereon, an inlet port for the precursor gas stream and an exhaust port for the release of unreacted materials and reaction byproducts;

(2) a precursor gas stream conducting tube or similar means which is passed through the reactor inlet port, for supplying said precursor gas stream to the substrate surface and at a velocity gradient effective to produce thereon a fine-grained and/or equiaxed deposit substantially free from columnar grains;

(3) precursor gas stream feed means from which volatile metal precursor species and (if necessary) reducing gas can be supplied; and (4) effluent or exit gas handling means for removing the unreacted gaseous feed materials and deposition reaction by-products from the reactor through the reactor exhaust port.

Any of the known designs of CVD reactors are suitable for use with the present inventive method. However, particularly desirable for use herein is a cold-wall reaction chamber wherein the substrate is heated to the temperature at which the CVD reaction takes place. Heating can be accomplished, for example, inductively, either directly or by using a susceptor (i.e., a body for holding a substrate which is capable of absorbing heat from a source and conducting the heat to the substrate); by direct electrical resistance; by electrical resistance of a heater contained within the substrate; by infrared heating means; by radiant heating or by radio frequency.

Normally, the precursor will condense on any relatively cool surface which it contacts. Thus, typically, all ports of the deposition system are desirably maintained at least as hot as the precursor gas stream, with the reaction portion of the system, i.e., the substrate, or at least the surface portion thereof, generally being much hotter than said stream, but preferably considerably below the melting temperature of the resulting deposit and substrate. Thus, keeping such considerations in mind, substrate temperatures in the present method can vary widely depending upon the particular deposition reaction taking place.

Reactor materials which risk exposure to reactant gases and reaction by-products such as the inlet tube, heating means, and substrate supporting means components, are preferably constructed of materials which are both structurally strong and chemically inert in the presence of the gases employed or formed in the CVD reaction.

In the present invention, as in conventional CVD processes, the precursor gas stream is caused to flow from suitable feed means through an inlet tube into the reactor means by a pressure differential or by the action of a carrier gas. To insure the unaided transport of said stream from the respective vapor precursor supply cylinders (or vaporizers if the metal precursor is not a gas at room temperature) into the deposition reactor, and to further insure the removal of potentially corrosive deposition reaction by-product materials, it is important to generate a vapor pressure substantially in excess of the deposition pressure, or to use a carrier gas at a high flow rate. An inert carrier is typically employed, or the reducing gas in the deposition reaction can be employed as the carrier gas in conjunction with a pressure differential.

In operating the process of the present invention, a vacuum pump may be employed to evacuate the reaction vessel and associated vacuum lines prior to start of the chemical vapor deposition reaction, as well as for establishing and maintaining a desired flow rate of reactant gases through the system.

The inlet tube for the precursor gas stream can have a narrowed aperture to increase volumetric flow rate. Said aperture can have various configurations, for example, as a slit, for added flexibility in forming deposits on the surface of a wide range of substrate shapes. Experience has shown that the inlet tube is preferably perpendicular or nearly perpendicular to the plane of a flat substrate.

In accordance with the present inventive method, the aperture of the inlet tube is positioned at a distance away from the surface of substrate to establish the desired velocity gradient of the precursor gas stream. For the purposes of the present invention, "velocity gradient" is defined as the gas velocity at the inlet tube aperture divided by the distance of said aperture from the surface of the substrate. The preferred minimum value thereof, effective to produce a CVD coating of fine-grained structure, is about 1050 cm./cm.-sec., and the especially preferred minimum which produces an equi-axed grain structure is about 2000 cm./cm.-sec.

However, the above definition of velocity gradient is strictly correct only when the reactor design is such that the flow of the precursor gas stream is directly toward the substrate surface and the vacuum port is on the opposite side of the substrate from the inlet port. If the position of the vacuum port and its distance from the substrate and/or inlet port are such that the precursor gas stream is other than directly toward the substrate—for example, when said port is relatively close to the substrate and at an angle substantially less than 180° from the inlet port, such as 90°—the velocity gradient is more difficult to calculate, but by reason of the deflection will always be less than as defined above. When such a reactor is employed, therefore, the distance of the aperture from the substrate and velocity of the precursor gas stream necessary for the present invention are preferably determined by simple experimentation.

The gaseous reactants are preferably introduced from their respective vessels through suitable flow controllers which serve to establish and monitor the desired flow conditions and reactant concentrations, and thus to maintain a desired ratio of hydrogen to metal compound.

In the method of the present invention, as in conventional CVD systems, it is important to remove unreacted feed materials from the reaction chamber to better maintain the desired ratio of hydrogen to metal compound at the substrate surface, and to quickly remove any corrosive by-products of reaction such as HF, which may etch the metal deposit in a reaction competing with deposition. Thus, as set out above, the present method is often preferentially carried out at reduced pressure with the reaction chamber exhaust being withdrawn by a vacuum pump or aspirator. Hot corrosive reaction gases are preferably withdrawn through a cold trap prior to passing through the vacuum pump which maintains the desired system pressure. Excess reducing gas and neutralized reaction gases can then be scrubbed and burned.

Those skilled in the art will recognize that the method generally described hereinabove may be difficult to practice efficiently in a manner which facilitates the production of large coated articles, such as X-ray targets. This is true because a fine-grained and/or equi-axed coating produced in a single CVD operation will cover only a relatively small area of the target very near the inlet port for the precursor gas stream, said area generally being no more than about 10 times the cross-sectional area of said port; the coating on more remote areas will be columnar or of mixed grain structure.

For practical commercial use, a method which will cover a much larger area is required. However, it is not practical simply to employ a larger diameter inlet port since flow rates so high as to be totally impractical would be necessary.

In another aspect of the invention, therefore, the above-described method is performed, and simultaneously, the substrate is moved relative to the precursor gas stream. Any suitable orientation of motion, including translation, rotation, oscillation and the like, may be employed; rotation is frequently convenient.

This aspect requires, in addition to the previously described apparatus elements, moving means operatively connected to the substrate supporting means for moving the substrate relative to the precursor gas stream, as by rotating or oscillating the same. It is also preferred that the aperture of the inlet tube for said gas stream be a slit, which enables said gas stream to be deployed at the required high velocities over areas of greater width.

Referring now to the drawings, FIG. 1 is a schematic cross-sectional view of one embodiment of a CVD reactor and attendant apparatus suitable to conduct the present inventive method in its broadest sense. The apparatus is depicted in a general fashion, only those portions necessary to illustrate the invention being shown; it should be understood, for example, that gaseous reactant flow controls, electrical power and heating sources, and other necessary mechanisms are also provided.

Sample holder or support means 2 maintains one or more substrates 4 in a position inside the reaction zone of CVD reaction vessel 6. Said vessel is further adapted with heating means (not shown), typically a direct inductive heating coil, to raise the temperature of the substrate to a level at which the chemical vapor deposition reaction takes place. As mentioned hereinabove, the substrate support means may be a susceptor for transferring heat to the substrate, although experience has shown that direct inductive heating provides the most efficient control and maintenance of the substrate surface temperature which can be conveniently monitored by use of conventional temperature control means such as an optical pyrometer (not shown), and which can be connected to an appropriate feedback control mechanism. The reaction vessel as shown is provided with exhaust port 8 through which unreacted metal precursors, reducing gas and gaseous by-products of reaction, such as HF, can exit into cold trap 12 prior to further treatment and ultimately waste disposal. Vacuum pumps (not shown) in flow communication with the cold traps are typically provided for evacuating the reaction vessel and associated vacuum lines prior to the start of a run, as well as for establishing and maintaining the desired pressure of reactant gases in the system.

The precursor gas stream, typically comprising a volatile metal halide and a reducing gas, e.g., hydrogen, is introduced through flow controllers 14 and 16, which serve to establish and monitor the desired flow conditions and reactant concentrations, e.g., the hydrogen to metal halide ratio, into inlet reactant gas conducting tube 18 through which said gas stream is delivered into deposition reaction vessel 6. The outlet of tube 18 is ordinarily adjustable in size, so that the precursor gas stream flows through at a desired constant velocity. Said outlet is positioned a distance away from the surface of substrate 4 to achieve, in conjunction with the aperture inlet reactant gas velocity, the desired velocity gradient of reactant gases being supplied to and impinging on the substrate surface. Inlet tube 18 is preferably adjustable so that the distance of the inlet aperture away from the substrate surface can be altered, depending upon particular reactants employed and the velocity gradient desired. Therefore, by simply adjusting the outlet diameter of inlet tube 18 or the distance of the inlet aperture from the substrate surface, an effective range of velocity gradients can easily be determined with minimal experimentation for a given precursor gas stream, to form fine-grained and equiaxed metal deposits substantially free of columnar grains.

As the CVD reaction takes place on the surface of the substrate, unreacted feed gases and reaction by-products are continuously removed from the reaction vessel at a controlled rate by the vacuum pump, typically through a throttle valve (not shown).

FIG. 2 a schematic cross-sectional view of one embodiment of a rotary disk CVD reactor and attendant apparatus suitable to conduct the method in its preferred aspect.

Sample holder or support means 22 maintains one or more substrates 24, typically thin wafers or a mandrel, in a position inside the reaction zone of rotary disk CVD reaction vessel 26 that is adapted for the deposition of a metal layer on the substrate(s). As shown, reaction vessel 26 is also equipped with rotating means which comprises motor 28, operatively connected via suitable vacuum-tight and air- and moisture-resistant coupling means to connecting rod 30 inside reaction vessel 26. As shown, the connection is through flange collar 32 and may involve a suitable inter-meshing gear arrangement, but other connecting means such as a magnetic coupling may be employed and are often preferred. Substrate support means 22 rests on or is attached to the end of rod 30, whereby rotation of said rod in a particular direction causes supporting means 22 with substrate 24 thereon to rotate in the same direction.

The reaction vessel further includes heating means 34, typically a direct inductive heating coil, for the purpose of raising the temperature of the substrate, or at least the surface thereof, to a level at which the CVD reaction takes place. The substrate temperature can be conveniently monitored by use of a thermocouple (not shown) which can be connected to an appropriate feedback control mechanism. Reaction vessel 26 as shown is provided with exhaust ports 36.

In operation of the embodiment shown in FIG. 2, the precursor gas stream is supplied through inlet tube 38 and aperture 40 to the surface of heated substrate 24 at the desired velocity gradient while said substrate is simultaneously rotated relative to said gas stream, causing the CVD reaction to take place and form the desired fine-grained and preferably equiaxed coating on continuously adjacent areas of the substrate surface. Thus, the breadth of the fine-grained and/or equiaxed portion of the deposit is influenced by the breadth of the aperture slit and the length of the deposit depends on the rotational motion of the substrate.

Further, in operation of the present inventive method, it is believed, without intending to limit the scope of this invention, that a period of substrate motion is preferably employed such that particles of the deposited material nucleate on the substrate surface when the grains have attained a specified maximum length, to prevent the formation of columnar grains, and to enhance fine-grained and/or equiaxed grain growth. Thus, an important consideration in producing preferred deposit structures in accordance with this invention is the fraction of total deposition time for exposure of any area of the substrate to the direct flow of the precursor gas stream and the frequency of exposure thereof. These can depend upon such factors as the film growth rate and the effectiveness of nucleation. As the period of rotation of the substrate is easily adjustable, the optimal exposure time and frequency of reexposure can easily be determined with minimal experimentation for a given set of reaction parameters.

In all respects not dealt with in detail immediately hereinabove, the operation of the apparatus of FIG. 2 is identical or similar to that of the apparatus of FIG. 1.

Another aspect of the invention is apparatus such as that described hereinabove for depositing a CVD coating on a surface, particularly of large area. Said apparatus comprises:

(A) a reactor including means for supporting and heating a substrate, (B) inlet means for introducing at least one gaseous reactant into said reactor at a velocity gradient effective to produce on said substrate a deposit substantially free from columnar grains, (C) outlet means for removing exhaust gases from said reactor, and (D) displacement means for moving said substrate relative to said inlet means.

The species of apparatus shown in the drawings are, of course, only illustrative, and many variations thereof are easily devisable by those persons skilled in the art. For example, the precursor gas stream may exit the feed inlet tube through a nozzle or similar means to better control and maintain the velocity thereof. It is contemplated in the practice of this invention that the flow of the reactant gas stream may be either steady state, pulse, periodic or non-periodic or any combination thereof. Still further, the reducing gas may be supplied to the reaction vessel with the metal compound or downstream thereof (but, of course, upstream from the substrate).

Although the method of the present invention may generally be applicable to many CVD processes, said method can be further conveniently illustrated by the deposition of tungsten, rhenium and tungsten-rhenium alloys by the respective vapor phase reduction by hydrogen of tungsten hexafluoride ($WF_6$), rhenium hexafluoride ($ReF_6$) and mixtures thereof on the surface of a graphite substrate.

In general, in preparing a fine-grained and preferably equiaxed deposit of tungsten, rhenium or a mixture thereof in accordance with the present inventive method, the substrate is heated to a temperature in the range of about 270°–1000° C. and preferably about 500°–700° C., and at a pressure in the range of about 0.1–1000 torr. The metal hexafluoride and $H_2$ are metered into the reactant gas inlet tube to premix the reactants in $H_2$/metal hexafluoride molar ratios ranging from 5:1 to 10:1.

The deposits produced by the method of this invention as broadly defined are characterized by a microcrystalline structure consisting substantially of homogeneous fine-grained and preferably equiaxed grains with average grain dimensions less than about 10,000 Angstroms. The hardness, tensile strength and flexibility of said deposits are substantially higher than those of columnar deposits.

In particular, the method of the invention in its preferred aspect is capable of producing articles comprising a substrate, preferably graphite, and a coating of at least one of tungsten and rhenium directly bonded thereto, a major proportion of said coating including the exterior surface thereof being substantially free from columnar grain structure and having an average grain size in the range of about 5,000–10,000 Angstroms. Such articles can be produced without recourse to such operations as brazing, and are useful as X-ray targets.

In practice, it is preferred to first deposit a coating of rhenium on a graphite substrate as a diffusion barrier, to inhibit the formation of tungsten carbide at the high temperatures (typically about 1100°–1200°) encountered during use of the X-ray target. Said diffusion barrier may be but is not necessarily fine-grained and/or equiaxed in structure. A fine-grained and/or equiaxed tungsten or mixed tungsten-rhenium layer is then deposited on the diffusion layer. By operating in this way, it is possible to produce articles which can survive many thousands of cycles when employed as X-ray targets.

The invention is illustrated by the following examples.

EXAMPLES 1-12

Tungsten was deposited by the vapor phase reduction of $WF_6$ by $H_2$. All films were deposited on rectangular pieces (51×76 mm.) of graphite substrate in a vessel 35.6 cm. high and 45.7 cm. in diameter. An inlet for the precursor gas stream was located at the top of the vessel, with the gases being metered in via mass flow controllers. A vacuum pump was used both to purge the system and to reduce the pressure therein, the line to the pump being located at the bottom of the vessel 7.6 cm. from the substrate. Said line was equipped with a 0–1000 torr pressure gauge and an MKS butterfly valve controller to maintain constant system pressure. An induction heater was used to heat the graphite with the heating coil entering through a reactor port. A thermocouple, entering through yet another port, measured the graphite temperature which was maintained by a feedback control mechanism. An additional reactor port contained a viewing window.

The graphite was suspended approximately 1.3 cm. above the induction coil by quartz rods. The precursor gas stream was introduced into the reactor by means of an inlet tube which was fitted with a union such that inlet apertures of varying diameters could be employed.

The distance from the inlet tube aperture to the graphite surface was varied from 51 mm. to 6.4 mm. for each of three tube aperture inner diameters employed (3.8, 2.0 and 1.1 mm.). During each deposition reaction, the substrate temperature was maintained at 675° C., the reactor pressure at 200 torr, the $H_2/WF_6$ ratio at 6 and the precursor gas stream flow rate of 1.15 standard liters per minute (slm.). Cross-sectional micrographs of each sample were taken and the results are summarized in Table I.

TABLE I

| Example | Tube diameter, mm. | Gas velocity, cm./sec. | Tube distance, mm. | Velocity gradient, cm./cm.-sec. | Deposit structure* |
|---|---|---|---|---|---|
| 1 | 3.8 | 647 | 51 | 127 | C |
| 2 | 3.8 | 647 | 25 | 255 | C |
| 3 | 3.8 | 647 | 13 | 510 | C |
| 4 | 3.8 | 647 | 6.4 | 1020 | C |
| 5 | 2.0 | 2318 | 51 | 456 | F |
| 6 | 2.0 | 2318 | 25 | 913 | F |
| 7 | 2.0 | 2318 | 13 | 1825 | F |
| 8 | 2.0 | 2318 | 6.4 | 3650 | M |
| 9 | 1.1 | 7596 | 51 | 1495 | F |
| 10 | 1.1 | 7596 | 25 | 2991 | M |
| 11 | 1.1 | 7596 | 13 | 5981 | M |
| 12 | 1.1 | 7596 | 6.4 | 11,962 | M |

*C - Polycrystalline, columnar grains.
F - Fine-grained, substantially free of columnar grains.
M - Microcrystalline (less than 1 micron), equiaxed deposits substantially free of columnar grains.

Examples 1–4 are typical of conventional CVD processes, and produced typical and expected columnar deposits. In this reactor, the precise location of the transition from columnar to fine-grained structure is uncertain but said transition definitely occurs at a velocity gradient as low as about 1050 cm./cm.-sec. The transition from fine-grained to equiaxed structure occurs at about 2000 cm./cm.-sec.

Further, the deposits of Examples 5–7 and 9 showed a circular dent formed in the deposit, directly under the inlet tube, which micrographs showed to contain fine-grained crystals. Those of Examples 8 and 10–12 showed small surface mounds formed inside large dents which upon micrograph analysis proved to be microcrystalline, equiaxed grains. At the perimeters of the mounds, spreading out through the dented area, the equiaxed structures gave way to the aforementioned fine-grained structures, containing slightly larger and more columnar grains. Further analysis showed that eventually the structures beyond the mounds and encircling dents became columnar.

Thus, the results indicate that a high velocity field of impinging reactant gases sufficiently near the reacting surface can disturb and alter the deposit crystal growth process. As velocity is increased at a given distance, or as the distance is decreased at a given velocity, the crystal structure of deposits progresses from columnar to finer-grained dents and finally to the most desirable microcrystalline, equiaxed deposits.

EXAMPLES 13-24

The procedure of Examples 1–12 was repeated, using a cold-wall, six-way cross reactor equipped with 15.2-cm. diameter arms and 20.3-cm. flanges. The line to the vacuum pump was located 15.2 cm. from the substrate on a port adjacent to the entry port and at a 90° angle therefrom. The flow rate of the precursor gas stream was 2.3 slm. The results are summarized in Table II.

TABLE II

| Example | Tube diameter, mm. | Gas velocity, cm./sec. | Tube distance, cm. | Apparent velocity gradient, cm./cm.-sec. | Deposit structure* |
|---|---|---|---|---|---|
| 13 | 3.8 | 1295 | 5.1 | 255 | C |
| 14 | 3.8 | 1295 | 2.5 | 510 | C |
| 15 | 3.8 | 1295 | 1.3 | 1020 | C |
| 16 | 3.8 | 1295 | 0.64 | 2039 | C |
| 17 | 2.0 | 4636 | 5.1 | 913 | C |

TABLE II-continued

| Example | Tube diameter, mm. | Gas velocity, cm./sec. | Tube distance, cm. | Apparent velocity gradient, cm./cm.-sec. | Deposit structure* |
|---|---|---|---|---|---|
| 18 | 2.0 | 4636 | 2.5 | 1825 | C |
| 19 | 2.0 | 4636 | 1.3 | 3650 | F |
| 20 | 2.0 | 4636 | 0.64 | 7300 | F |
| 21 | 1.1 | 15,191 | 5.1 | 2991 | C |
| 22 | 1.1 | 15,191 | 2.5 | 5981 | M |
| 23 | 1.1 | 15,191 | 1.3 | 11,962 | M |
| 24 | 1.1 | 15,191 | 0.64 | 23,925 | M |

In Table II, the velocity gradient column is designated "apparent" because the actual figures are uncertain but are unquestionably substantially lower than those given, owing to the deflection of the gas stream by reason of the 90° angle between the inlet and vacuum ports and the close proximity of the vacuum port to the inlet port and substrate. However, the same trend is shown as in Examples 1-12, with a transition from columnar to fine-grained and finally equiaxed structure as the velocity gradient increases.

EXAMPLES 25-28

The apparatus of Examples 13-24 was employed, with a 2.0 mm. inlet tube aperture positioned 1.3 cm. from the graphite surface, substrate temperature at 675° C., reactor pressure at 200 torr and $H_2/WF_6$ ratio at 6. The precursor gas stream flow rate was varied from 2.3 to 5.3 slm., which corresponds to velocities from 4636 to 10,683 cm./sec. Characteristics of the resulting deposits are summarized in Table III.

TABLE III

| Example | Gas flow rate, slm. | Velocity, cm./sec. | Flow rate, slm. $H_2$ | Flow rate, slm. $WF_6$ | Apparent Velocity gradient, cm./cm.-sec. | Deposit structure |
|---|---|---|---|---|---|---|
| 25 | 2.3 | 4636 | 2.0 | 0.3 | 3650 | F |
| 26 | 2.8 | 5645 | 2.4 | 0.4 | 4444 | M |
| 27 | 3.5 | 7056 | 3.0 | 0.5 | 5554 | M |
| 28 | 5.3 | 10,683 | 4.5 | 0.75 | 8411 | M |

The data in Table III further show that high velocities are necessary to effect a desirable, and improved non-columnar grain structure.

EXAMPLES 29-37

The apparatus of Examples 13-24 was employed, with a 2.0-mm. inlet tube aperture positioned 1.3 cm. from the graphite surface, a precursor gas stream flow rate of 2.8 slm. resulting in an apparent velocity gradient of 4444 cm./cm.-sec. and a $H_2/WF_6$ ratio of 6. Deposits were produced at three reaction temperatures, each at three pressures. Characteristics of the resulting deposits are summarized in Table IV.

TABLE IV

| Example | Substrate surface temperature, °C. | System pressure, torr | Deposit structure |
|---|---|---|---|
| 29 | 550 | 50 | M |
| 30 | 550 | 200 | F |
| 31 | 550 | 500 | F |
| 32 | 650 | 50 | F |
| 33 | 650 | 200 | M |
| 34 | 650 | 500 | F/M* |
| 35 | 750 | 50 | M |
| 36 | 750 | 200 | M |
| 37 | 750 | 500 | F/M |

*Overlapping regions of fine-grained and equiaxed deposits.

The data in Table IV indicate an increase in deposition rate as temperature and pressure are increased and that temperature and pressure are not critical to the present invention.

EXAMPLES 38-40

The apparatus of Examples 13-24 was employed, with a 2.0-mm. inlet tube aperture positioned 1.3 cm. from the graphite substrate surface and under the following reaction conditions: substrate surface temperature 675° C., system pressure 200 torr, total gaseous reactant flow rate 2.8 slm. and a resulting apparent velocity gradient of 4,444 cm./cm.- sec. For each example, the $H_2/WF_6$ ratio was varied and the characteristics of the resulting deposits are summarized in

TABLE V

| Example | $H_2/WF_6$ | $H_2$, slm. | $WF_6$, slm. | Structure |
|---|---|---|---|---|
| 38 | 3 | 2.1 | 0.7 | M* |
| 39 | 6 | 2.4 | 0.4 | M |
| 40 | 13 | 2.6 | 0.2 | F |

*Large void fraction in film.

The data in Table V indicate that the $H_2/WF_6$ ratio affects the size of the fine-grained or equiaxed region produced in the deposit. High ratios apparently suppress the formation of nuclei and thus result in fine-grained films, intermediate ratios give the preferred equiaxed result, and very low ratios, although giving an equiaxed structure, also result in voids within the film, which are undesirable.

EXAMPLE 41

An apparatus such as described in FIG. 2 was employed. It included a 5.1-cm. diameter metal ring welded to the top of rod 30, to support a graphite disk 10.1 cm. in diameter and 0.64 cm. thick. The precursor gas stream, consisting of $WF_6$ and hydrogen, was introduced into the vessel through an inlet tube containing an aperture slit 0.397 mm. by 1.6 cm. The slit was directed upward toward the bottom surface of the substrate and was positioned normal to the surface approximately 0.64 cm. away. An induction heater coil was located directly over the substrate surface which was preheated to 600° C. in a hydrogen atmosphere ($H_2$, 6.0 slm.), with a reaction vessel pressure of 200 torr.

The substrate was rotated at a constant speed of 15 rpm. The flow rate of tungsten hexafluoride into the inlet tube was controlled to produce a $H_2/WF_6$ ratio of 6:1 and a precursor gas stream flow rate of 7.0 slm., thereby providing a velocity at the inlet aperture of 7,068 cm./sec. and an apparent velocity gradient of 11,130 cm./cm.-sec.

Following the resulting deposition, the disk was sectioned and the grain structure determined after polishing and etching with Murakami etch. The grain structure of the deposit over the entire area provided to be similar to that performed with a single slit and a stationary piece of graphite, but encompassed a 1-inch wide ring on the substrate surface.

EXAMPLE 42

The procedure of Example 41 is repeated, substituting rhenium hexafluoride for the tungsten hexafluoride and varying certain parameters as follows: pressure 50 torr, $H_2/ReF_6$ ratio 200:1, precursor gas stream flow rate 6.0 slm., apparent velocity gradient 38,200 cm./cm.-sec. A rhenium coating about 10-20 microns thick is thus prepared. There is then deposited on the rhenium coating an alloy coating with a thickness of 900-1000 microns, by the deposition of a mixture of tungsten hexafluoride and rhenium hexafluoride under the conditions employed in Example 41 except as follows: precursor gas stream flow rate 6.8 slm., velocity gradient 6,800 cm./cm.-sec. It is machined back to a thickness of 700 microns.

Microscopic analysis of a cross-section of the article thus prepared shows the tungsten-rhenium alloy deposit to be equiaxed. Coatings of this type are particularly useful as X-ray targets by reason of superior mechanical strength and ability to withstand severe temperature cycling conditions.

EXAMPLE 43

The procedure of Example 42 is repeated, except that tungsten hexafluoride is substituted for the tungstenrhenium hexafluoride mixture and the tungsten coating is deposited to a thickness of about 1000 microns and machined back to 800 microns. Microscopic analysis shows the tungsten alloy deposit to be equiaxed. Coatings of this type are much less expensive than tungsten-rhenium alloy coatings and are similarly useful.

EXAMPLE 44

By a procedure similar to that of Example 43, a graphite X-ray target substrate was coated with 15 microns of rhenium as a diffusion barrier; 1000 microns of equiaxed tungsten was then deposited thereon and machined back to 850 microns. It was then tested for use as an X-ray target by being subjected to the equivalent of a number of 2-second scans in a computed tomography X-ray scanner. With a 10,000-rpm. rotation, any position on the focal track was exposed to the electron beam 667 times per scan. The target survived for a total of 38,700 scans, failing at that time as a result of loss of adhesion between the rhenium and graphite layers; no radial cracking was observed.

What is claimed is:

1. A method for forming a homogeneous fine grained solid deposit on the surface of a substrate by chemical vapor deposition from at least one gaseous reactant, said method comprising supplying said gaseous reactant or reactants to the surface of the substrate at a velocity gradient effective to produce said homogeneous fine grained metallic deposit consisting essentially of a metal selected from the group consisting of silver, aluminum, gold, beryllium, chromium, copper, iridium, molybdenum, niobium, nickel, platinum, rhenium rhodium, tantalum, tungsten, vanadium and a mixture thereof, said deposit being substantially free from columnar grains, and said velocity gradient being at least about 1050 cm./cm.-sec.

2. A method according to claim 1 which comprises the steps of:
   (a) supporting said substrate in a reaction chamber which comprises a gaseous reactant inlet tube, a gas exhaust and a substrate heating means,
   (b) supplying said gaseous reactant or reactants into said reaction chamber through said inlet tube, and to the surface of said substrate at an effective velocity gradient to produce said deposit, and
   (c) heating said substrate to a temperature to cause said reaction which directly forms said deposit on the surface of said substrate from the gaseous reactantor reactants.

3. A method according to claim 2 wherein the substrate is graphite

4. A method according to claim 3 wherein the gaseous reactant mixture comprises hydrogen and at least one volatile metal halide.

5. A method according to claim 4 wherein the metal halide is tungsten hexafluoride, rheniumhexafluoride or a mixture thereof.

6. A method according to claim 5 wherein the temperature of the substrate is maintained in the range of about 270°-1000° C.

7. A method according to claim 6 wherein the velocity gradient is at least about 1050 cm./cm.-sec.

8. A method according to claim 7 wherein the hydrogen to metal hexafluoride molar ratio is maintained between 5:1 and 10:1.

9. A method according to claim 8 wherein the reaction pressure is maintained in the range of about 0.1-1000 torr.

10. A method according to claim 9 wherein the pressure is below atmospheric pressure.

11. A method according to claim 10 wherein the gaseous reactant or reactants are supplied through a tube with a narrowed aperture.

12. A method according to claim 11 wherein the velocity gradient is at least about 2000 cm./cm.-sec.

13. A method according to claim 7 wherein the metal is tungsten.

14. A method according to claim 7 wherein the metal is rhenium.

15. A method according to claim 7 wherein the metal is a tungsten-rhenium mixture.

16. A method according to claim 3 wherein the substrate is moved relative to the stream of gaseous reactant or reactants.

17. A method according to claim 16 wherein the substrate is graphite.

18. A method according to claim 17 wherein the metal halide is tungsten hexafluoride, rhenium hexafluoride or a mixture thereof.

19. A method according to claim 16 wherein the substrate is rotated or oscillated.

20. A method according to claim 19 wherein the temperature of the substrate is maintained in the range of about 270°-1000° C.

21. A method according to claim 20 wherein the velocity gradient is at least about 1050 cm./cm.-sec.

22. A method according to claim 21 wherein the hydrogen to metal hexafluoride molar ratio is maintained between 5:1 and 10:1.

23. A method according to claim 22 wherein the pressure is below atmospheric pressure.

24. A method according to claim 23 wherein the gaseous reactant or reactants are supplied through a tube with a slit.

25. A method according to claim 24 wherein the velocity gradient is at least about 2000 cm /cm.-sec.

26. A method according to claim 25 wherein the metal is tungsten.

27. A method according to claim 25 wherein the metal is rhenium.

28. A method according to claim 25 wherein the metal is a tungsten-rhenium mixture.

29. A method for forming a homogeneous equiaxed solid deposit on the surface of a substrate by chemical vapor deposition from at least one gaseous reactant, said method comprising supplying said gaseous reactant or reactants to the surface of the substrate at a velocity gradient effective to produce said homogeneous equiaxed metallic deposit consisting essentially of a metal selected from the group consisting of silver, aluminum, gold, beryllium, chromium, copper, iridium, molybdenum, niobium, nickel, platinum, rhenium, rhodium, tantalum, tungsten, vanadium and a mixture thereof, said deposit being substantially free from columnar grains and having average grain dimensions of less than 10,000 Angstroms, and said velocity gradient being at least about 2000 cm.cm.-sec.

30. A method of depositing a homogeneous equiaxed solid deposit on the surface of a flat graphite substrate by chemical vapor deposition comprising:

supporting said substrate in a reaction chamber maintained at about 0.1–1000 Torr;

maintaining said surface at a temperature of about 500°–700° C.;

rotating or oscillating said substrate;

mixing hydrogen and a metal halide at a molar ratio of hydrogen to said metal halide of about 5:1–10:1 to form a gaseous reactant mixture, said metal being selected from the group consisting of tungsten hexafluoride, rhenium hexafluoride and a mixture thereof;

supplying said gaseous reactant mixture at a velocity gradient of at least about 2000 cm./cm.-sec. nearly perpendicular to said surface of said flat substrate through a tube with a slit;

conducting said unreacted gaseous reactant mixture as well as any corrosive by-products of the reaction away from said surface; and forming said homogeneous equiaxed solid deposite of metallic tungsten, rhenium, or a mixture thereof, substantially free from columnar grains and having a grain size of about 5,000–10,000 Angstroms on said surface of said flat graphite substrate.

31. The method according to claim 30 wherein said solid deposit comprises a coating of rhenium on said graphite substrate followed by a coating of tungsten coating on top of said coating of rhenium.

* * * * *